(12) United States Patent
Lorito

(10) Patent No.: US 6,437,576 B2
(45) Date of Patent: *Aug. 20, 2002

(54) METHOD FOR DETECTING SHORT-CIRCUIT CONDITIONS AND DEVICE WHICH USES THIS METHOD

(75) Inventor: Fabrizio Lorito, Milan (IT)

(73) Assignee: ABB Research Ltd., Zurich (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,657

(22) Filed: Jun. 5, 1998

(51) Int. Cl.$^7$ ............................ G01R 31/02; G06G 7/34
(52) U.S. Cl. ..................... 324/509; 324/522; 324/649; 324/424; 702/65; 361/93.1
(58) Field of Search ................. 324/509, 510, 324/511, 522, 535, 424, 605, 649; 361/93.1; 702/58, 59, 65; 700/292, 293

(56) References Cited

U.S. PATENT DOCUMENTS

| | | | | |
|---|---|---|---|---|
| 3,599,044 A | * | 8/1971 | Takemura et al. | 361/82 |
| 3,904,859 A | * | 9/1975 | Poncelet | 702/65 |
| 4,150,411 A | * | 4/1979 | Howell | 361/45 |
| 4,767,996 A | * | 8/1988 | Jinzenji | 324/522 |
| 5,537,327 A | * | 7/1996 | Snow et al. | 700/293 |
| 5,734,575 A | * | 3/1998 | Snow et al. | 700/293 |

FOREIGN PATENT DOCUMENTS

| | | |
|---|---|---|
| DE | 36 42 136 A1 | 6/1988 |
| DE | 41 11 831 A1 | 10/1992 |
| DE | 44 29 191 A1 | 2/1996 |
| EP | 0 244 284 A | 11/1987 |
| EP | 0 473 428 A2 | 3/1992 |

\* cited by examiner

*Primary Examiner*—N. Le
*Assistant Examiner*—Vincent Q. Nguyen
(74) *Attorney, Agent, or Firm*—Bryan Cave LLP

(57) ABSTRACT

Method and device for the rapid detection of short-circuits in an electrical network. The method is based on estimating the electrical characteristics of the short-circuit load and calculating the peak value of the current on the basis of N successive samplings of the instantaneous current (i(t)). If the calculated value, typically available before the current actually attains this value, is greater than a pre-established threshold (Icc), a signal (C) is emitted indicative of a short-circuit fault. The calculation of the peak value may occur automatically for example upon switching on, or be subject to the exceeding of a guard threshold (Is) by the instantaneous current (i(t)). Moreover, the method makes it possible concurrently to determine the value of the power factor of the short-circuit (cos φ) and the phase of the voltage at the moment of the short-circuit.

9 Claims, 2 Drawing Sheets

METHOD FOR DETECTING SHORT-CIRCUIT CONDITIONS AND DEVICE WHICH USES THIS METHOD

BACKGROUND OF THE INVENTION

The present invention relates to a method able rapidly to detect the initiating of short-circuit conditions in an electrical network, as well as to a device which uses this method.

The invention will be illustrated with particular reference to a preferred application in a low-voltage electrical power distribution network, although this is not to be understood as limiting, and in any event the invention applies in general to both medium and low-voltage networks.

In modern automatic circuit breakers for low and medium voltage, devices for detecting faults are integrated in the circuit breakers, and such detection of faults is often performed by means of devices of electronic type.

However, the detection of short-circuits, characterized by very high current and by the need for very rapid actuation so as to eliminate the fault, is still carried out at the present time by electromechanical devices based on the electrodynamic effect.

The calibration of these short-circuit detection devices is very difficult and is carried out on an empirical basis. This leads to low accuracy in the determination of the actuation times of the circuit breaker.

Moreover, with these electromechanical devices it is not possible to gather, in the case of a short-circuit fault, detailed information about the fault such as, for example, the peak current characterizing the fault, the complex impedance of the circuit or the angle of the voltage at the moment of extinction of the fault. This information would be useful among other things for diagnostic and statistical purposes.

Finally, in an automatic circuit breaker based on the known short-circuit detection mechanism, it is not possible to prevent the opening of the circuit breaker once the fault has been detectd. However, in many situations, such as for example when the circuit breaker is part of a power distribution network which comprises other circuit breakers, it is desirable for just one of them to open the circuit, even if the fault was detected by several circuit breakers simultaneously.

There is therefore a technical need to make available a circuit breaker device which is capable of detecting a short-circuit fault without necessarily involving the opening of said circuit breaker, since the opening operation may be subject to other parameters and/or assigned to other circuit breakers present in the network.

SUMMARY OF THE INVENTION

The objective of the present invention is to solve the technical problem illustrated above, by overcoming the limitations of the prior art, and in particular to carry out the rapid detection of short-circuit conditions in a network, with simultaneous calculation of the value of the power factor of the short-circuit (cos φ) and of the phase of the voltage at the moment of the short-circuit.

These objectives are achieved by means of the invention which relates to a method for detecting short-circuit conditions in an electrical network comprising at least one voltage source connected to at least one load, characterized in that it comprises the following operational phases:

a) measuring the values of the instantaneous current i(t) flowing in the load and of its first derivative di(t)/dt;

b) performing N successive samplings of the values of the instantaneous current i(t);

c) estimating the effective value of the load R, L viewed by the said source;

d) generating a short-circuit detection signal C when the value of the estimated load is such as to cause the steady peak current to exceed an assigned threshold level Icc.

The invention relates, moreover, to a device for detecting short-circuit conditions in an electrical network comprising at least one voltage source connected to at least one load, the said device being characterized in that it comprises:

an analogue differentiator which receives as input a signal proportional to the instantaneous current i(t) and delivers as output a signal which represents the first derivative di(t)/dt thereof;

two analogue/digital converters whose inputs are connected to the said signal i(t) and to the output of the said differentiator; and processing and detection means connected to the outputs of the said converters and able to output a signal representative of the short-circuit conditions C.

The invention relates, moreover, to a device for detecting short-circuit conditions in an electrical network comprising at least one voltage source connected to at least one load, the said device being characterized in that it comprises a digital/analogue converter which receives as input a signal proportional to the instantaneous current i(t), a digital differentiator (or filter) connected to the output of said converter, and processing and detection means, connected to the outputs of said converters and digital differentiator, said means being able to output a signal representative of the short-circuit conditions C.

According to the invention, the detection of short-circuit conditions is based on estimating the electrical characteristics of the load under short-circuit conditions, and more particularly its impedance. The peak value of the current is typically calculated from this, before the current actually attains the said peak value. If this value is greater than a desired threshold Icc, then the fault is detectd as a short-circuit.

Alternatively, more complex fault conditions can be defined, in which the threshold value Icc depends upon the value of cos φ.

The method according to the invention makes it possible to achieve detection very rapidly, typically in a few milliseconds.

Advantageously, the method according to the invention makes it possible concurrently to determine other characteristics of the circuit at the moment of the fault, such as the value of the power factor of the short-circuit (cos φ) and the phase of the voltage at the moment of the short-circuit.

BRIEF DESCRIPTION OF THE DRAWINGS:

The invention will now be described with reference to the appended drawings relating to its preferred but non-limiting embodiments, in which.

DESCRIPTION OF THE PREFERRED EMBODIMENTS

The basic principles of the method according to the invention will firstly be illustrated with reference to FIG. 3.

In this figure, the electrical network whereto the invention is applied is represented by means of a voltage source 10, and a load having a reactive component L (of inductive type) and a resistive component R. The source 10 is for example a sinusoidal generator (V) of known frequency (for example 50 Hz) and known peak value (for example 220×√2 volt). It should be stressed that the source 10, illustrated in FIG. 3 as a voltage generator, is in reality a schematization of different sources and generators present in the network. The network can be a single-phase, three-phase or in general a polyphase network.

The device according to the invention is represented by means of a block 11 provided with a circuit breaker 12 inserted in series between the generator 10 and load (i.e. the rest of the network). The opening of the circuit breaker is controlled by circuitry (not shown) which comprises suitable sensors and which uses the method of the invention to detect a possible short-circuit condition.

Figure 4:
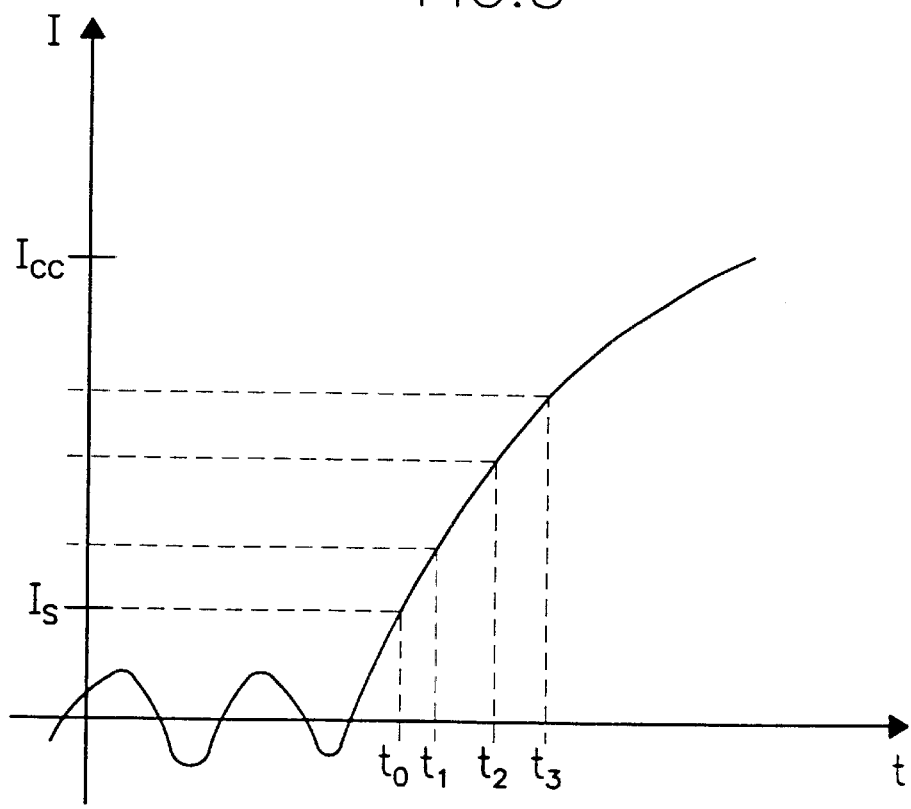
FIG. 4 is a graph which illustrates the pattern of behaviour of short-circuit conditions.

With reference also to FIG. 4, according to an alternative embodiment, the method of the invention provides for the definition of a first "guard" threshold level indicated Is. In other words, the instantaneous current i=i(t) flowing in the load is monitored and it is determined whether it exceeds a first threshold level. According to another more general form, the method does not provide for such a constraint, and passes directly to the phases described below continuatively and/or periodically, starting from the instant at which the network is powered, or following some other pre-established event(s).

If there is provision for the guard threshold, upon exceeding this threshold, which may constitute the beginning of a short-circuit or form part of a transient, a sampling is begun of successive values taken by the current, at pre-established intervals, for example those indicated by the times t1, t2, t3 etc. in FIG. 4. The behaviour pattern of the current i(t) is reconstructed or predicted on the basis of these values, and the parameters of the load are derived from it. These parameters are then compared with reference values so as to establish whether a short-circuit is occurring. If there is no provision for the guard threshold, the sampling can be carried out continuously.

It is important to note that, according to the invention, the detection of the short-circuit conditions (i.e. when the threshold peak current is >Icc) is not normally obtained from a measurement, since the proposed method is capable of estimating or forecasting in advance —based on previously stored values—the behaviour pattern of the current, and hence the imminent exceeding of the threshold Icc. Even when, in the case of a very fast short-circuit transient, detection is carried out with a very short or practically zero advance, the method of the invention nevertheless makes it possible to obtain information about this short-circuit.

According to a preferred embodiment, illustrated in detail below, the estimate of the behaviour pattern of the current from the samples is obtained by the least squares method and using normalized values of the current for simplicity of processing. The method for detecting a short-circuit according to the invention therefore provides for the following steps:

when the instantaneous value of the normalized current I(t) exceeds a normalized threshold value Is, i.e. Is=3, the behaviour of the normalized current I(t) is calculated. In the circuit of FIG. 3, the normalized current I(t) can be expressed by the following relation:

$$I(t)=+\alpha I'(t)+\beta \cos(wt)+\gamma \sin(wt) \quad (1)$$

where:

$$\alpha=-\tan \Phi; \quad (2)$$

$$\beta=ki \cos \theta/\cos \Phi; \quad (3)$$

$$\gamma=ki \sin \theta/\cos \Phi; \quad (4)$$

$$\Phi=\arctan (L/R)$$

Io=normaliztion constant (typically the normal current which characterizes the circuit breaker);

Vo=nominal peak voltage (for example VO=220√2 V)

w=nominal angular frequency of the electrical network (e.g. 50 Hz), with w=2πf

I(t)=i(t)/Io

I'(t)=[di(t)/dt].(1/wIo)

θ=phase of the voltage.

The parameter ki is the ratio between the peak value which the current i(t) attains when steady and the value Io, and kilo represents the peak value which the current will attain when steady. Ki can be exspressed as:

$$ki=[(Vo)/R^2+W^2L^2)^{1/2}]/Io$$

or considering the above-given definitions:

$$ki=(\beta^2+\gamma^2)/(1+\alpha^2)]^{1/2}$$

It is clear from the above that in order to estimate the effective parameters of the circuit (R, L), it is enough to estimate the value of the parameter Id.

Figure 3:
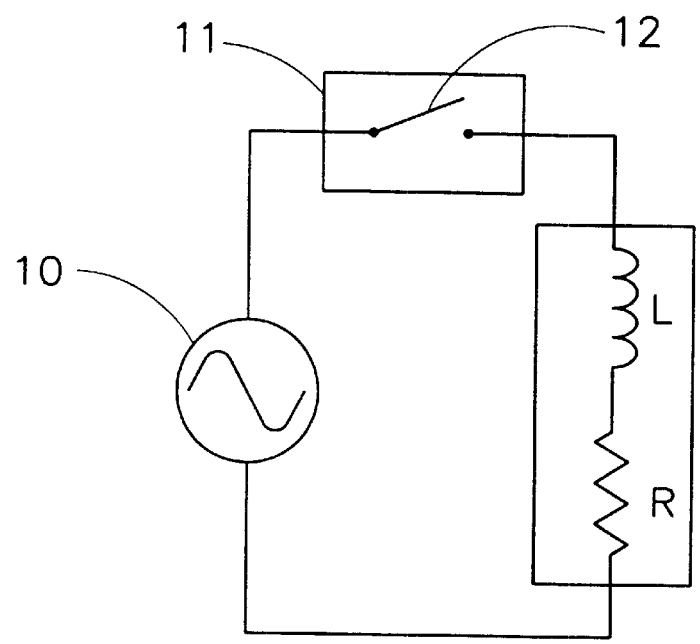
FIG. 3 is a schematic representation of a network for illustrating the principles of the invention.

The phase of the voltage θ is a parameter such that, having fixed the time origin, the time profile of the voltage v(t) of the sinusoidal generator 10 of FIG. 3 can be defined as:

$$v(t)=Vo \cos(wt+\theta)$$

As already indicated, FIG. 3 is an equivalent representation ("Thevenin equivalent") of the electrical network considered, so that the components 10, R, L are not necessarily physical components, but the "equivalent generator" and the "equivalent load" viewed by the device 11.

The parameter N can be determined as follows: if Dt is the duration of the sampling interval (for example 100 microseconds), and Tr is the time required for detection (for example 3 ms), then N can be expressed as:

$$N=Tr/Dt$$

The relation 1 can be expressed in the following vectorial form:

$$[I(t)]=[\epsilon 40][\Phi(t)]$$

where, the vector Φ(t) is defined as $$\Phi(t) = \begin{vmatrix} I'(t) \\ \sin wt \\ \cos wt \end{vmatrix}$$

and let Φ(t)' be the transposed vector of Φ(t).

The vector ε' is the transposed of the vector $$\varepsilon = \begin{vmatrix} \alpha \\ \beta \\ \gamma \end{vmatrix}$$

The vector ε is calculated as $$\varepsilon^* = \left[\sum_{t=1}^{N} \Phi(t)(\Phi(t))'\right]^{-1} \cdot \left[\sum_{t=1}^{N} \Phi(t)I(t)\right]$$

and the elements of ε* are defined as:

$$\varepsilon^* = \begin{vmatrix} \alpha^* \\ \beta^* \\ \gamma^* \end{vmatrix}$$

so that ki* is expressed by:

$$ki^* = (\beta^{*2} + \gamma^{*2})/(1+\alpha^{*2})^{1/2}$$

The value ki* is compared with the threshold k0. Preferably, a short-circuit situation is defined as a condition in which the value ki exceeds a preset threshold ko, typically, but not exclusively ko=12.

If ki*>k0 then a short-circuit condition does exist; otherwise the method is reiterated from the step of monitoring the current. The sign * indicates that these are values obtained by estimation.

From the vector ε indicated above it is also possible to calculate also the estimate cos φ* of the parameter cos φ and the estimate θ* of the parameter θ using the following formulae:

$$\cos \phi^* = 1/(1+\alpha^{2*})^{1/2}$$

$$\theta^* = arc \cos(\cos \phi^*/ki^*)$$

As indicated previously, other alternative methods, such as that of the mean quadratic value (known in the art by the initials LMS), etc., may be employed to estimate the short-circuit current.

Figure 1:
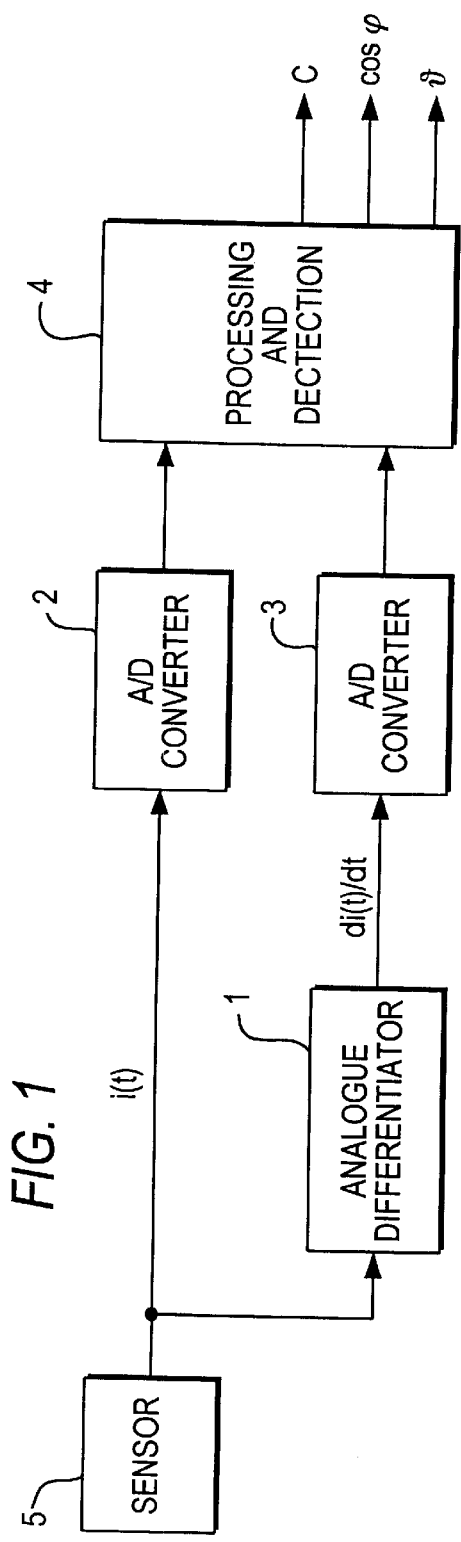
FIG. 1 schematically illustrates a structure of the detection device according to the invention.

FIG. 1 illustrates an embodiment of the device according to the invention which comprises an appropriate analogue differentiator filter 1 which calculates the instantaneous derivative of the current.

The analogue differentiator 1 receives as input a signal proportional to the instantaneous current i(t), for example via the sensor 5, and delivers as output a signal which represents the first derivative thereof, i.e. "di(t)/dt". The device moreover comprises two analogue/digital converters, 2 and 3 respectively, which convert into digital form the signal i(t) and its derivative output by the differentiator 1. The outputs from the converters are fed to the processing and detection block 4 which, using the method of the invention, detects the short-circuit and outputs a signal C, as well as the signals cos φ and θ which are representative of the angular phase and of the angle of extinction.

Preferably, the processing in the block 4 is executed by means of a programmed microprocessor system, although it is possible to use analogous discrete devices, either analogue or digital.

Figure 2:
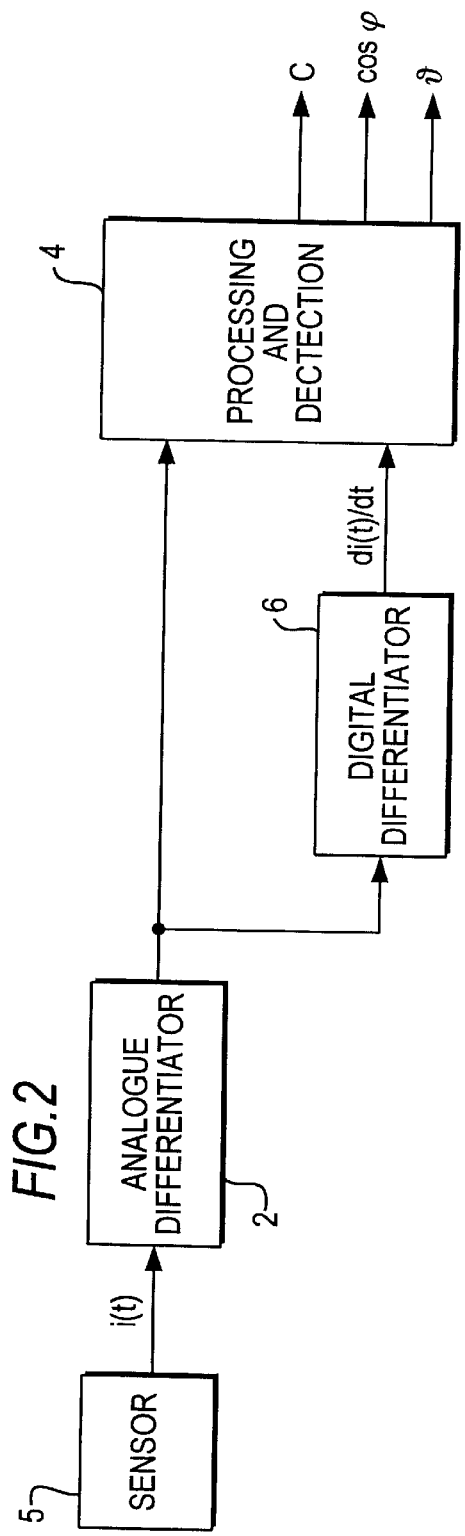
FIG. 2 illustrates an other embodiment of the device.

In the variant embodiment of FIG. 2, on the other hand, in which the same references have been used for corresponding parts, there is provided an A/D converter 2 which receives as input the signal i(t), and a digital differentiator (or filter) 6 connected to the output of this converter. The outputs of the blocks 2 and 6 are then connected to the block 4, in a manner analogous to the above.

The above description relates to single-phase systems, however the invention can be applied also to the detection of short-circuits in two-phase or three-phase systems. In the case of systems on several phases, the method is applied independently on the different phases.

The invention has been described with reference to particular and preferred embodiments, however it is not limited to what was described, but embraces the variants and modifications which will be evident to a person skilled in the art.

What is claimed is:

1. A method for detecting short-circuit conditions in an electrical network comprising at least one voltage source connected to at least one load having a reactive component of inductive type and a resistive component, the method comprising the steps of:
   a) measuring the values of the instantaneous current flowing in the load and calculating the first derivative of said current;
   b) performing N successive samplings of the values of the instantaneous current;
   c) estimating the values of said reactive component of inductive type and of said resistive component of the load viewed by said voltage source; and,
   d) generating a short-circuit detection signal when the values of said reactive component of inductive type and of said resistive component of the load are such as to cause a peak current to exceed an assigned threshold level.

2. The method according to claim 1, wherein the said step (b) can be subject to the attaining, by the instantaneous value of the instantaneous current of a further threshold.

3. Method according to claim 1, wherein the said source is a sinusoidal voltage generator.

4. Method according to claim 1, wherein the said electrical network is a low or medium-voltage network.

5. Method according to claim 1, wherein the said network is a three-phase network, and the instantaneous current is the current in each phase.

6. Method according to claim 1, wherein the number N of successive samples of the values of the instantaneous current is fixed and defined as N=Tr/Dt, where Tr is the time required for detection and Dt is the duration of the sampling interval.

7. Method according to claim 6, wherein the estimate of the said effective parameters of the circuit is obtained by the least squares method.

8. A device for detecting short-circuit conditions in an electrical network comprising at least one voltage source connected to at least one load in which an instantaneous current flows and having a reactive component of inductive type and a resistive component, comprising:

an analog differentiator which receives as input signal proportional to the instantaneous current measured in the load and outputs a signal which represents the first derivative of said instantaneous current;

two analog/digital converters whose inputs are connected, respectively, to the said signal proportional to the instantaneous current and to the output of the said differentiator; and processing and detection means connected to the outputs of said convertors and able to estimate effective values of the resistive component and of the reactive component of inductive type of said load viewed by said voltage source, in order to generate a signal representative of the short-circuit conditions, the said processing and detection means being able additionally to output signals representative of the value of the power factor of the short-circuit and the phase of the voltage at the moment of the short-circuit.

9. A device for detecting short-circuit conditions in an electrical network comprising at least one voltage source connected to at least one load, in which an instantaneous current flows and having a reactive component of inductive type and a resistive component, comprising:

an analog/digital converter which receives as an input signal proportional to the instantaneous current which flows through said load;

a digital differentiator connected to the output of said converter; and, processing and detection means, connected to the outputs of said converter and of said digital differentiator, said processing and detection means estimating effective values of said resistive component and of said reactive component of inductive type of said load viewed by said voltage source, in order to generate a signal representative of short-circuit conditions, the said processing and detection means being able additionally to output signals representative of the value of the power factor of the short-circuit and the phase of the voltage at the moment of the short-circuit.

* * * * *

UNITED STATES PATENT AND TRADEMARK OFFICE
CERTIFICATE OF CORRECTION

PATENT NO.   : 6,437,576 B2
DATED        : August 20, 2002
INVENTOR(S)  : Fabrizio Lorito It is certified that error appears in the above-identified patent and that said Letters Patent is hereby corrected as shown below:

Column 7,
Line 1, after "input", please insert -- a --.

Signed and Sealed this

Eleventh Day of March, 2003

JAMES E. ROGAN
*Director of the United States Patent and Trademark Office*